United States Patent [19]
Gudesen

[11] Patent Number: 6,064,615
[45] Date of Patent: May 16, 2000

[54] OPTICAL MEMORY ELEMENT

[75] Inventor: Hans Gude Gudesen, Fredrikstad, Norway

[73] Assignee: Thin Film Electronics ASA, Oslo, Norway

[21] Appl. No.: 09/101,024

[22] PCT Filed: Dec. 23, 1996

[86] PCT No.: PCT/NO96/00308

§ 371 Date: Jun. 29, 1998

§ 102(e) Date: Jun. 29, 1998

[87] PCT Pub. No.: WO97/24715

PCT Pub. Date: Jul. 10, 1997

[30] Foreign Application Priority Data

Dec. 28, 1995 [NO] Norway ................................ 955337

[51] Int. Cl.⁷ .............................. G11C 7/00; G11B 7/013
[52] U.S. Cl. ........................................ 365/215; 369/275.1
[58] Field of Search .............................. 365/64, 106, 124, 365/125, 127, 215; 369/275.1

[56] References Cited

FOREIGN PATENT DOCUMENTS

WO91/11804  8/1991  WIPO .
WO93/13529  7/1993  WIPO .

*Primary Examiner*—Trong Phan
*Attorney, Agent, or Firm*—Jacobson, Price, Holman & Stern, PLLC

[57] ABSTRACT

An optical memory element (ME) wherein data are written and read by light incident to the memory element constitutes an integral unit crated by a transparent body. The body includes a light-focusing part and at least one light-sensitive layer, and the light-focusing part focuses the incident light on the light-sensitive layer. In a first method for production of such an optical memory element (ME) the transparent body can be formed from a material with a high refractive index or refractive index gradient, and the light-sensitive layer is formed by the addition of a light-sensitive material by coating or diffusion. In an alternative method for production of the memory element (ME) a transparent body of a material with a low refractive index or refractive index gradient may be employed, and the light-sensitive layer can be formed on the outside of a transparent cladding layer which is placed on the outside of the body. An optical memory module (MM) can be obtained by linking two or more memory elements (ME) in a large assembly, the individual memory elements being arranged immobilized in relation to one another in a two-dimensional surface. A memory module (MM) of this kind which includes two or more memory elements (ME) can be produced from a matrix by moulding, casting or stamping in a continuous or discontinuous process or a mixture of such processes.

37 Claims, 8 Drawing Sheets

OPTICAL MEMORY ELEMENT

FIELD OF THE INVENTION

The invention concerns an optical memory element wherein data are written and read by means of light incident on the memory element. The invention also concerns methods for manufacturing optical memory elements wherein data are written and read by means of light incident on the memory element. The invention further concerns an optical memory module, wherein the memory module comprises two or more memory elements wherein data are written and read by means of light incident to the memory element, and wherein the memory elements are produced by one of the methods according to the invention. Finally, the invention concerns a method for manufacturing an optical memory module, wherein the memory module comprises two or more memory elements wherein data are written and read by means of light incident to the memory elements, and wherein the memory elements are produced by one of the methods according to the invention.

BACKGROUN OF THE INVENTION

Optical storage methods for storing data and information have gradually become more and more widespread and in a number of areas of application have ousted data storage media based on magnetic film, but have also been employed for storage purposes where the use of magnetic storage media is not practical, but where there is nevertheless a requirement for large storage capacity, high storage density and rapid access.

For instance international published application WO91/11804 discloses an optical data storage medium with light focusing parts in the form of preferably monodisperse transparent spheres with a diameter in the range of 1–100 $\mu m$ micrometer. These spheres focus incident light onto a light sensitive layer or burn film with changeable optical properties, said burn film forming a plane substantially tangential to the microspheres and hence not coincident with the imaging surfaces or focal planes thereof. In a preferred embodiment WO91/11804 proposes to overcome this disadvantage by locating the microspheres in pits and providing burn-film at the bottom of the pits at some distance from the microsphere, while shaping the bottom of the pit like a part of a spherical surface concentric with the microsphere located in the pit such that ideal focusing on the burn-film is achieved for all angle of incidence. This arrangement is, however, difficult to achieve in a manufacturing environment without resorting to costly alignment and corrective measures in order to obtain the desired shape of the pit bottom.

International published application WO93/13529 discloses an optical memory wherein data is stored in an optical layer 19 with changeable optical properties. This data layer 19 is spaced apart from an array of multisurface imaging lenslets 21 and writing of data in the data layer takes place by guiding light from recording light sources via a beam splitter and through optical means including the lenslet array and onto the data layer. For reading data stored in the data layer, the data layer is illuminated by a different set of light sources and imaged through the same optical means including the lens array 21 and onto a sensor array located on the opposite side of the beam splitter. In contrast with optical data storage medium of WO91/11804, the optical memory of WO93/13529 provides a rather voluminous memory module and involves a rather complicated optical arrangement in order to address the data storage medium proper.

SUMMARY OF THE INVENTION

The object of the present invention is to provide optical storage media with high storage capacity and permitting rapid access to the stored data. A second object of the present invention is to provide components for optical storage media, with the aim of producing the components cheaply and efficiently partly by means of known technology and methods and employing the components in large capacity optical storage media.

A further object of the present invention is to provide methods for manufacturing components for optical storage media and production of such storage media, of which the said components form an integral part.

The above-mentioned and other objects are achieved according to the invention with an optical memory element which is characterized in that the memory element constitutes an integrated unit created by a wholly or partly transparent body, that the body comprises a light-focusing part and at least one light-sensitive layer, that at least one section of a surface of the memory element is parallel to or approximately coincident with an imaging surface for the incident light which is focused through the light-focusing part, said light-sensitive layer being provided adjacent to said at least one section of said surface and substantially conformal therewith, and that said light-sensitive layer comprises a material whose optical properties can be changed by the influence of the incident light, said light-focusing part in its external form or volumetric refractive index distribution being arranged to focus the incident light at said light-sensitive layer. A first method according to the invention for production of such an optical memory element is characterized by designing the memory element in the form of a wholly or partly transparent body, forming said wholly or partly transparent body from a material whose refractive index or refractive index gradient is such that light incident to said body is focused at an opposite surface of said body, and forming at least one light-sensitive layer on said opposite surface or in said body immediately inside said opposite surface and substantially conformal therewith, by the addition of a light-sensitive material, said addition being implemented by coating or diffusion of said light-sensitive material from the gas phase, vapour phase, liquid phase, solid phase or molten phase respectively. A second method according to the invention for production of such an optical memory element is characterized by designing the memory element in the form of a wholly or partly transparent body, forming said wholly or partly transparent body from a material whose refractive index or refractive index gradient is too low for light incident to said body to be focused at an opposite surface of said body, providing an optically transparent layer on the opposite surface, of said body, the thickness of said transparent layer being chosen so that light incident to said body is brought into focus near an outer side of said transparent layer, and forming at least one light-sensitive layer on the outside of said transparent layer and substantially conformal therewith by the addition of a light-sensitive material, said addition being implemented by coating or diffusion of said light-sensitive material from the gas phase, vapour phase, liquid phase, solid phase or molten phase respectively.

An optical memory module based on the memory elements according to the invention is characterized in that the individual memory elements are arranged immobilized in relation to one another in a two-dimensional surface. Finally, a method for manufacturing of such an optical memory module is characterized in that the memory module is produced from a matrix by moulding, casting or stamping in a continuous or discontinuous process or a mixture of such processes.

BRIEF DESCRIPTION OF THE DRAWINGS

The invention will now be explained in more detail by means of embodiments and with reference to the accompanying drawing, in which FIGS. 1a, b, c, d show examples of memory elements according to the invention.

DETAILED DESCRIPTION OF THE PREFERRED EMBODIMENTS

An optical memory element according to the invention is a small, complete component for optical storage of data or information, with a structural member in the form of a transparent body with a single light-focusing part with a large numerical aperture, and a layer or volume which stores information as spatially varying optical properties.

FIG. 1 shows different types of memory elements ME. In the FIGS. 1a, 1b and 1c the memory elements are shown with light beams incident from three different directions. FIG. 1a illustrates a memory element which is made of a microsphere with a high refractive index, FIG. 1b a memory element which is made of a microsphere with cladding and FIG. 1c a memory element which is made of a moulded piece of glass or polymer.

Figure 1A:
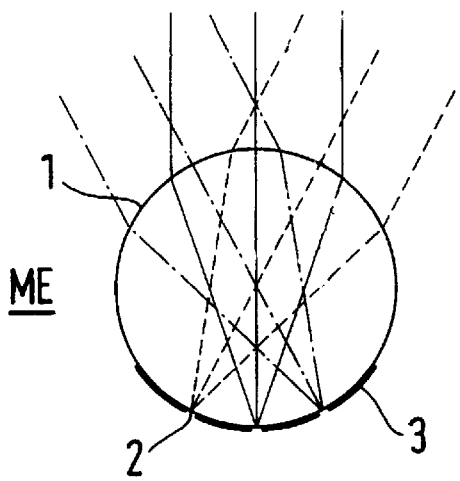
Figure 1B:
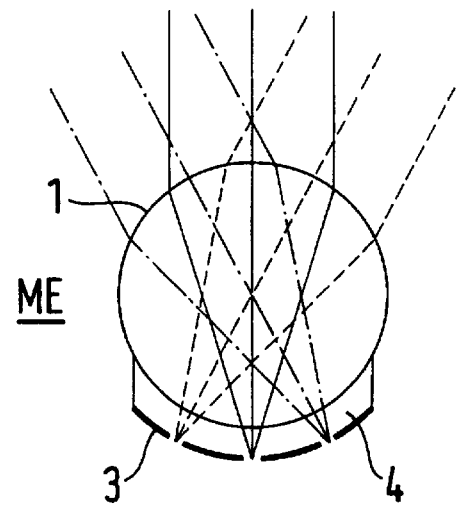
Figure 1C:
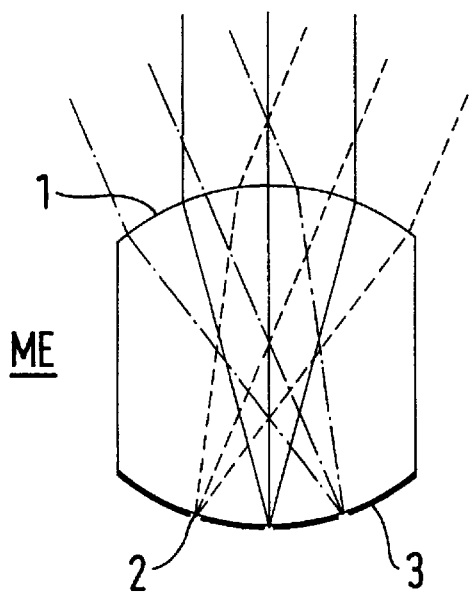
Figure 1D:
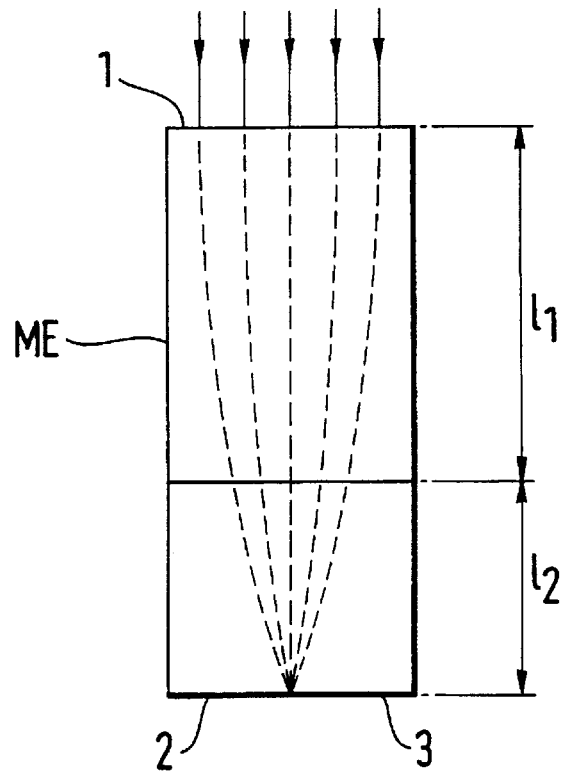

FIG. 1d illustrates an alternative design of an optical memory element ME according to the invention, in which a lens is used with a graded refractive index or a so-called GRIN lens. As illustrated in FIG. 1d this consists of a cylindrical body where the refractive index diminishes from the cylinder axis outwards. An optical memory element can be produced by a GRIN lens by coupling to a homogeneous material, i.e. a material which does not have a graded refractive index, with a light-sensitive layer provided on the end. By selecting the correct refractive indices and refractive index distribution, together with the lengths $l_1$ and $l_2$ incident light which strikes the front of the GRIN lens will be focused at the light-sensitive layer. Cases which are of special interest are those where the light beam is focused on the back of the GRIN lens, i.e. $l_2=0$. In this case the memory element according to the present invention can be made of optic fibre with a graded index (GRIN fibre) which is cut to the correct length with flat surfaces, on one of which surfaces there is applied a light-sensitive layer. Analogously, memory modules according to the present invention can be made of GRIN fibre by packing a number of pieces of fibre of this type in a bundle and gluing them together to form a block. A method and technique of this kind resembles the so-called SLA (Selfoc Lens Arrays). SLA consist of broad bundles of parallelly arranged and glued-together Selfoc fibre lenses with graded index. SLA are used as relay optics in copying machines, fax machines etc. and are sold in great volumes.

In the memory element ME illustrated in FIG. 1 the surface with the light-focusing part 1 is termed the front surface, and the surface on the opposite side, where in many cases, but not always, imaging takes place is termed the rear surface 2. As illustrated in FIG. 1, the actual structural member or the body which constitutes the memory element may be a body of transparent glass or polymer material, shaped on one side to form the front surface with the light-focusing element and shaped on the rear surface to conform with an imaging surface. The intervening volume is filled with a glass or polymer material, with dimensions chosen to optimize the imaging process for each specific set of operating parameters. The information-carrying layer or volume 3 may consist of an extremely thin film, e.g. of a thickness from approximately ten to several hundred angstroms, or it may extend through a portion of the volume of the memory element. Virtually any type of information-bearing layer currently used in optical data storage is a candidate for incorporation in the memory element according to the present invention, including films in the categories ROM, WORM (Write Once, Read Many Times) and ERASABLE. The information-carrying layer or volume will henceforth be termed the information layer and is according to the present invention a light-sensitive layer which comprises a material whose optical properties are altered under the influence of the incident light.

As will be more closely described in the following, memory elements ME according to the present invention can be used as individual components or they can be physically linked to one another to form assemblies incorporating an array, for example from two to several millions of memory elements in a fixed spatial relationship to one another. In the latter case, two-dimensional regular arrays of memory elements according to the invention can be employed to form memory modules with large storage capacity and which provide possibilities for high speed parallel writing and reading of data. Such assemblies of memory elements according to the invention will henceforth be termed memory modules MM. Each memory module MM according to the invention will normally have dimensions which may be from a few hundred microns to several centimeters.

Examples will now be described of memory elements ME, in which the structural member or the transparent body is formed from a material with a high refractive index. In the examples, and as illustrated in the figures, the transparent body will appear as a microsphere, but it should be understood that the invention is by no means limited to microspheres, and that the transparent body or the structural member can just as well be designed as shown in FIG. 1c or FIG. 1d.

First of all the focusing of light inside microspheres will be discussed. According to geometrical optics a sphere with a refractive index 2.0 in air (n=1) focuses paraxial light rays on its rear surface, i.e. the surface opposing that where the light beams enter the sphere, cf. FIG. 1.

If the entire surface of the microsphere is illuminated with a collimated light beam, spherical aberration will cause rays near the rim to bend more strongly, striking the optical axis at points inside the sphere. For this reason spherical particles can be employed as retroreflecting elements in road signs, etc., and thus are made with a refractive index which is slightly lower than 2, typical values normally being 1.9–1.5. In this case the near-collimated incident and reflected light beams are obtained by a large fraction of the light being focused near the back wall of each sphere. Non-collimated light beams will come into focus inside or outside the sphere, depending on whether the incident light beam is converging or diverging when it strikes the sphere. Thus in every case imaging will take place on or near the rear surface of the sphere, the optimum value of the sphere's refractive index being dependent on the illuminated opening or aperture of the sphere, the beam characteristics of the incoming light, the refractive index of any contiguous embedding or sealing materials, as well as the size of the sphere relative to the wavelength of light (diffraction effects).

Individual differences notwithstanding, a high refractive index is required in all cases where the light is not sharply converging when it strikes the sphere. This rules out the use of microspheres made from the most common optically transparent polymers, including commercially available monosized polymer particles manufactured by the so-called Ugelstad process (swollen emulsion polymerization, cf. NO-PS no. 141 367, no. 142 082 and no. 143 403).

On the other hand microspheres are made from glass with a high refractive index or other materials in very large quantities for use in optically reflecting sheeting, in chemistry and in medicine. These microspheres are generally not monodisperse or of uniform size, but vary quite considerably with respect to diameter within each batch. Sieving, centrifugation, sedimentation or cyclone fractionation are industrially viable processes which can be used in such cases for selecting spheres within defined size ranges. However, such processes will tend to increase the costs of the microspheres, and this has to be weighed up against the advantages thereby obtained. In this connection it should be noted that for collimated, incident light incident on high-index spheres and within the geometrical optics approximation, the focus will always be formed on the rear surface of the microsphere, regardless of the diameter of the microsphere. The shorter focal length inside small spheres is automatically adjusted by the stronger curvature of the sphere surface.

In most of the anticipated applications the memory elements ME according to the present invention will be small, and when the term "microspheres" is used below to describe the memory elements' structural member or transparent body, this implies that the transparent body is a transparent solid sphere with a diameter which may be from a few microns up to approximately 1 mm.

A description will now be given of how data are stored as a pattern of information-bearing areas with optical contrast on a part of the surface of the microsphere, as illustrated schematically in FIG. 2, where the writing is performed on the back of a microsphere with a high refractive index. Only the central beam for 5 incident light beams is shown. The angle addresses are defined by the angles θ, φ.

The back 2 of the microsphere is covered with a thin film, also called burn film, which constitutes the information-carrying layer, henceforth termed the information layer. The film is transformed physically and/or chemically when it is exposed to intense light illumination, with a concomitant change in the optical response, for example in the form of reflection, transmission, fluorescence, scattering, etc, when probing light is employed, i.e. light used to inspect the optical response and which has too low intensity or is too weak to cause transformations in the light-sensitive layer or the information layer 3.

Depending on the film material and the mode of illumination, the optical response of the light-sensitive layer to the probing light (henceforth termed the logic state) will be of a binary nature (i.e. changed or not chanced) or it may yield a multi-bit response, e.g. expressed by a step in a gray scale.

Figure 2:
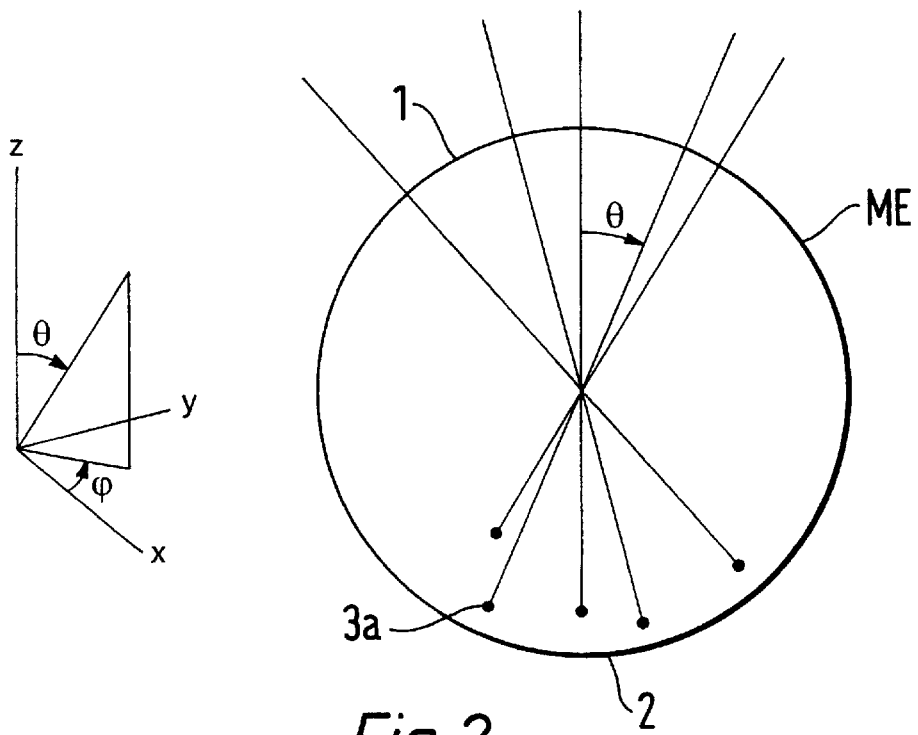
FIG. 2 writing in a memory element according to the invention.

Data are written into the memory elements ME by illuminating them with a series of intense impulses of collimated light, which strikes the microsphere from a predetermined group of directions, as illustrated in FIG. 2. In each case the light is focused at the back of the microsphere, where small spots 3a are created in the light-sensitive or information layer 3, one spot for each direction where light is applied. Each spot has a well-defined position with respect to a set of reference spots which are also written and which define a local coordinate system. Thus any position in the information-carrying layer on the back wall will be described by a unique coordinate, e.g. as illustrated in FIG. 2 by the polar angles φ,θ of corresponding incident light beams which are focused to this point. The spots are positioned in a group of N available areas or memory cells in the information layer, each sufficiently large to accommodate a described spot, and each identified by its predetermined coordinates $\theta_i$, $\phi_i$, where $1 \leq i$ is$\leq N$. Thus the data are stored in the memory element according to the invention as a series of addresses $\theta_i$, $\phi_i$ and the logic state for each address. Data are read by illuminating each memory cell in turn with a probing beam or reading beam and recording the corresponding logic state with a system which detects and classifies the optical response for this location in the information layer. As mentioned above, the memory elements according to the invention may be used as single, isolated units or components, or in an assembly of memory elements in order to form memory modules MM according to the present invention.

Memory elements ME, for example, which are based on microspheres will now be considered as isolated units. A memory element with a diameter of 50 pm can typically accommodate up to 15–25000 spot positions, which with binary coding of logic state in the information layer implies a raw data content in the range of 2–3 Kbyte. Gray scale encoding will multiply this number by a factor of up to 4–5. Thus even a single microscopic particle in the form of a memory element according to the invention can carry a message of considerable length and complexity. One potential application is the use of the memory element according to the present invention as an identification agent, where such memory elements are added to objects, bulk materials or liquids as descriptors of composition, origin, history and authenticity. Even with a highly differentiated code such applications will require less than the potential storage capacity of the memory element according to the invention, thus providing possibilities for redundancy and simplified read-out schemes to increase reliability and practical usefulness of the memory element in such a case.

Figure 3A:
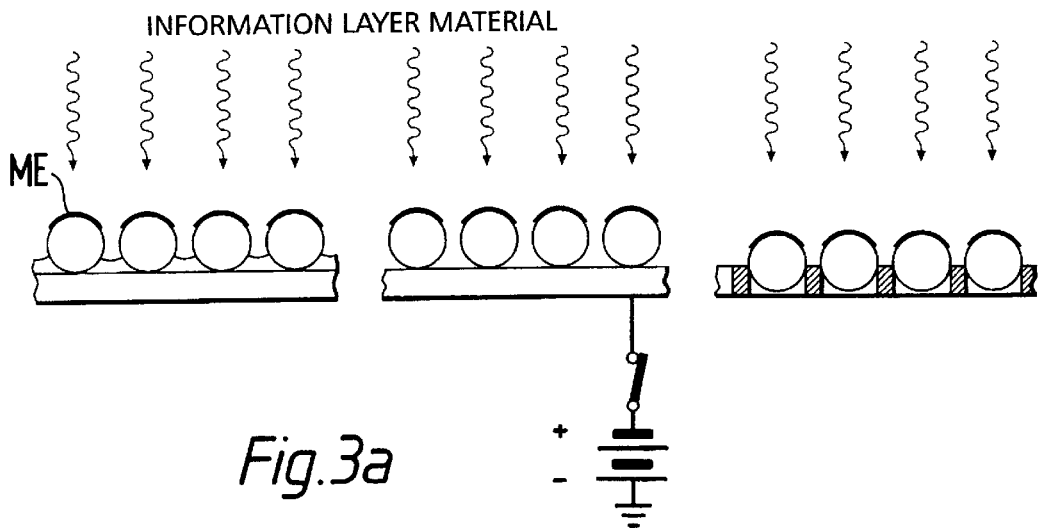
FIGS. 3a, 3b, and 3c feature steps in the manufacture of individual memory elements according to the invention.
Figure 3B:
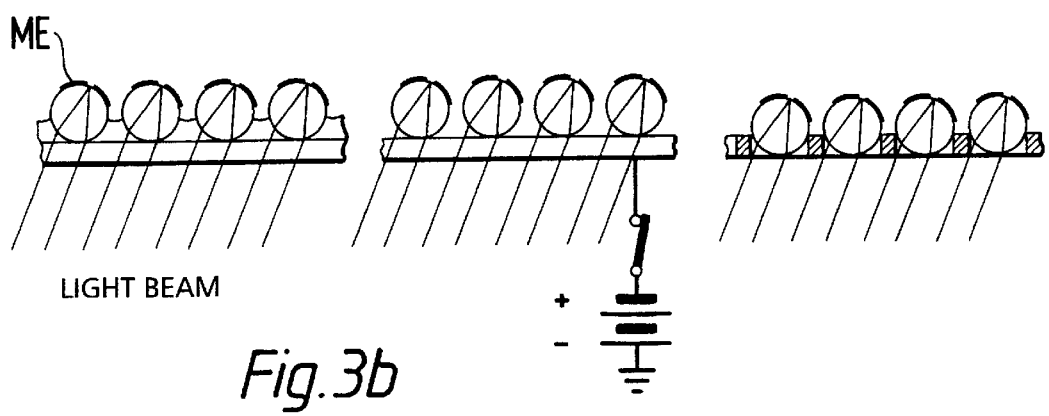
Figure 3C:
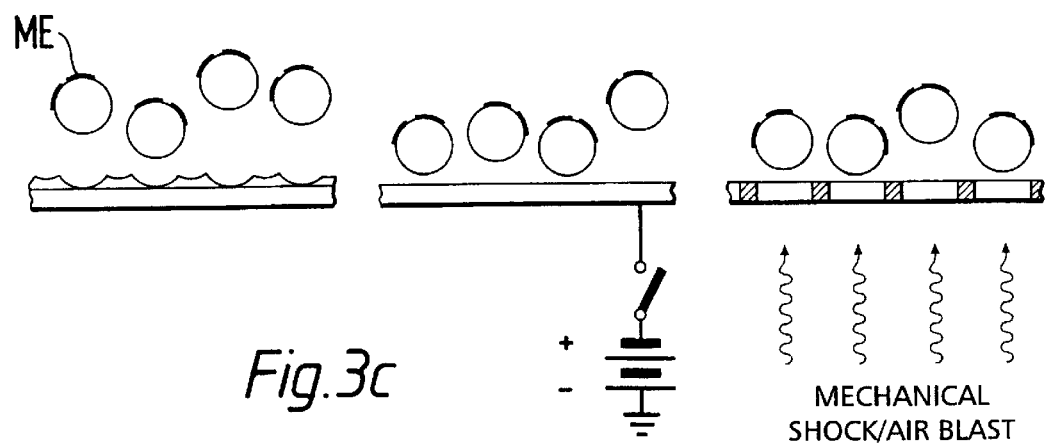

FIGS. 3a–c illustrate some stages in the manufacture of individual memory elements ME with the transparent body in the form of microspheres with a high refractive index. The microspheres are attached by means of 3 different mechanisms, the left column showing the use of an adhesive with a low refractive index, the central column electrostatic attraction and the right column wedging in the opening in a wire mesh or a membrane. FIG. 3a illustrates application of the information layer, FIG. 3b writing of reference coordinates and FIG. 3c release of the memory elements from the retaining surface.

The examples in FIGS. 3a–c of the manufacture of memory elements ME according to the invention show cases where the information layer or the light-sensitive layer are applied by sputtering or evaporation in a vacuum. The microspheres are temporary immobilized on a surface by a retaining tool, e.g. in FIG. 3a by means of an adhesive means which is subsequently removed by heating or dissolution, followed by washing, in FIG. 3b by means of electrostatic attraction and finally in FIG. 3c by wedging the microsphere in a wire mesh or a perforated membrane, followed by mechanical removal.

The exposed surface of each microsphere, i.e. that which is not facing the retaining tool, is then coated with materials which form the information layer. Even though evaporation or sputtering in a vacuum were explicitly mentioned in connection with FIG. 3, these are of course not the only application methods which are possible. Others include the use of diffusion, sublimation, condensation, electrostatic or ballistic spraying, electrochemical deposition, etc.

The next step will be to write coordinate marks and data into each memory element ME. As illustrated in FIG. 3b this can be done while the microsphere is still immobilized on the retaining tool, by illuminating on the microspheres from the tool side. As illustrated in FIGS. 3a and 3b, this implies that the tool and (in the case of FIG. 3a) the glue must be transparent and of adequate optical quality to allow access for the writing light. In the case illustrated in FIG. 3c, the mechanical retaining structure must likewise provide access for light. In order to achieve the highest data capacities for each memory element, a large aperture is required with angles of incidence spanning a wide range.

Depending on their intended use, all the memory elements ME on the retaining tool may be written with the same information or they may carry individual messages. In the former case the memory elements may be randomly positioned on the retaining tool and written in the desired set of directions $\theta_k$, $\phi_k$, by broad beams which illuminate all the memory elements simultaneously. This can be done by sequential switching between different illumination or incident directions, or in a single flash through a mask which is pre-encoded with the message in question. In the latter case each memory element can be written separately by a system which is capable of locating the memory element and directing light upon it in a selective manner. Even though this can be achieved on memory elements which are randomly disposed across the surface of a retaining tool, e.g. by automatic, optical searching systems, considerable advantages can be realized by pre-arranging the memory elements in a dense, regular pattern on the retaining tool. In addition to simplifying the task of localizing each memory element, this enables the memory elements to be arranged more densely, leading to a higher yield and larger throughput.

The memory elements ME can be removed from the retaining tool in different ways. In a first case in which an adhesive means or glue is employed, the temperature is reduced, thus releasing the adhesive bond by differential expansion or by embrittlement of the glue. This can be combined with mechanical shock or vibration. The temperature may be increased to above the melting point of the glue, followed by evaporation of the glue. Finally the temperature can be increased, thus causing the glue to soften, followed by dissolution or washing away the glue residue.

In a second case, where electrostatic attraction is employed, the voltage is quite simply turned off, followed by mechanical shock, e.g. by means of a piezo-electric hammer. In a third case, where the memory elements ME or the microspheres are securely wedged, mechanical force is applied, e.g. in the form of a shock or vibration, or by means of an air blast.

Methods of reading data from memory elements ME in the form of isolated units will be known to those skilled in the art and will therefore not be discussed in more detail here.

Now shall be discussed memory modules MM in the form of assemblies of memory elements according to the present invention and which are based on microspheres with a high refractive index, even though it should be understood that the memory module is naturally not restricted to the use of memory elements with microspheres, but that the memory elements which form part of the micromodules can also include structural members or transparent bodies in a different form, e.g. as illustrated in FIG. 1c or 1d.

By immobilizing several memory elements ME in a regular pattern on the surface of a data carrier in the form of a tape, foil, card or disc, the task of presenting each memory element to the writing and reading software becomes relatively straightforward. At the same time a physical entity is created, namely a memory module MM according to the invention and whose storage capacity can be increased virtually ad libitum by constantly adding more memory elements, thus also providing opportunities for achieving parallel reading and writing of data on a large scale.

Technical procedures for the preparation of microsphere-based memory elements ME will only be briefly discussed here, since they involve a number of steps, where each step is within known art or described in patents pending.

The main steps in the case of spheres with a high refractive index will be to select the desired sphere size fraction by sieving or the like, and to organize the spheres in a to-dimensional pattern. This can be done, e.g., on a patterned surface which is intended to form the final fixture holding the memory elements in place during their intended use, or it can be performed on an organizing tool which subsequently releases the spheres and transfers them in the correct arrangement on to another surface. Application of the information layer or the light-sensitive layer can also be performed on spheres that are immobilized in the desired pattern. This is done in analogy with the abovementioned case of memory elements as isolated units. Depending on the memory module architecture, the application is performed before, or after transfer in the case where an organizing tool is employed. A more detailed understanding of these issues can be obtained in the description of the closely analogous case of memory elements made from microspheres which are partially cladded, see below with reference to FIG. 4 and with reference to FIG. 6. The final stage in the manufacture is the application of a protective coating and finishing, e.g. encoding of cue marks, testing, etc.

In general, microspheres of near-identical diameter will simplify several of the manufacturing stages and provide higher data densities than microspheres whose diameters vary widely. It should be emphasized, however, that the basic concept can accommodate microspheres in inhomogeneous size mixtures, i.e. multidisperse mixtures.

As described above, the focusing and addressing within each high-index microsphere is largely independent of the sphere diameter. Ashen the memory elements ME are arranged in a grid pattern, the centre-to-centre distance between neighbouring memory elements can be selected to be constant while at the same time being sufficient to accommodate the largest memory element present. The vacant spaces between the memory elements will then vary randomly, reflecting random variations in the size of the nearest-neighbour memory elements. Clearly, a narrow size distribution for the memory elements will allow for a grid pattern with few vacant spaces and thereby also high data density.

Simultaneous read-out of data in the Gi,(pi positions in all memory elements ME within a large area is achieved by illuminating them with a broad, collimated light beam which is incident in the direction $\theta_i$, $\phi_i$. Each memory element in the assembly responds according to its data content at $\theta_i$, $\phi_i$, emitting or transmitting light which is transferred on to an electronic array detector in a single imaging operation. Such imaging becomes possible since the imaging and detection system are only intended to resolve optically details in the data storage medium, i.e. the individual memory elements in the assembly, which in this context are very large. The spots in the burn film or in the information-bearing layer on each memory element normally have a diameter of under one micron and can only be discerned by a powerful objective with a limited field of view and a depth of resolution of approximately 1 $\mu$m. Each memory element normally has a diameter of 10–1000 $\mu$m and can be imaged by a wide-field optical system with a depth of field in the range 100 $\mu$m to 10 mm.

The task of the imaging and detection system will be to determine the optical response to illumination, thus enabling it to be detected from each memory element as a unit with the co-ordinates x,y and each given illumination direction $\theta_i$, $\phi_i$. In this case the x,y values can be derived from the location of the memory element's image on the array detector, while the illumination directions $\theta$, $\phi$ are defined by the reading unit illuminator and are thus known.

There shall now be discussed how memory elements and memory modules according to the invention can be manufactured from microspheres which are partially cladded.

A number of polymer materials used in optical components have a refractive index n=1.6 or less, and spheres made from such materials would focus collimated light at points outside the sphere.

Figure 4A:
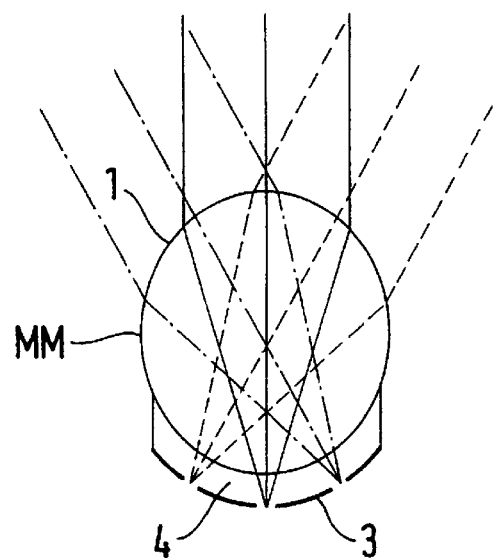
FIGS. 4a, b features in the manufacture of optical memory elements according to the invention FIG. 5 steps in a production process for manufacturing optical memory elements according to the invention.
Figure 4B:
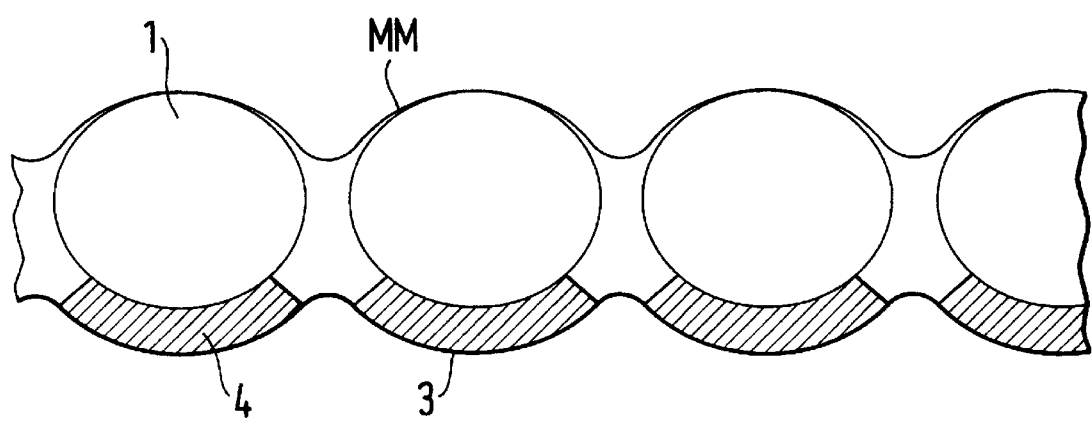

FIG. 4a shows a memory element ME made of a partially cladded sphere with light beams incident from three different directions. As illustrated in FIG. 4a, in this case the memory element ME can be constructed by cladding the rear surface of the sphere to form a boundary surface concentric with the sphere and with a burn film or an information layer at the correct distance from the centre of the sphere in order to obtain an optimized focus. The cladding thickness depends on the refractive indices of the sphere and the cladding materials, which may be identical for the individual memory elements. FIG. 4b shows how a memory module MM which constitutes an optical structure on a large scale is produced by linking memory elements ME in a two-dimensional, connected sheet structure.

Much of the description of memory elements ME made of microspheres with a high refractive index will also apply to memory elements made with cladding, whether used singly or in assemblies. In the latter case, large scale parallel writing and reading again becomes possible. It should be noted, however, that an assembly made from microspheres which differ from one another in size cannot be made as simply in the case where cladding is necessary. Spheres of different sizes with a high refractive index can be organized in a two-dimensional pattern on a surface, followed by coating in situ with burn film, protective layers, etc. This is because each microsphere forms a focal point at its back wall, regardless of the sphere diameter. On the other hand, microspheres with partial cladding will require a different cladding thickness for each sphere diameter. Availability of monosized microspheres is therefore very advantageous, permitting a simultaneous application of cladding on a large number of microspheres organized on a surface. This assumption will also be made in the following description.

Figure 5:
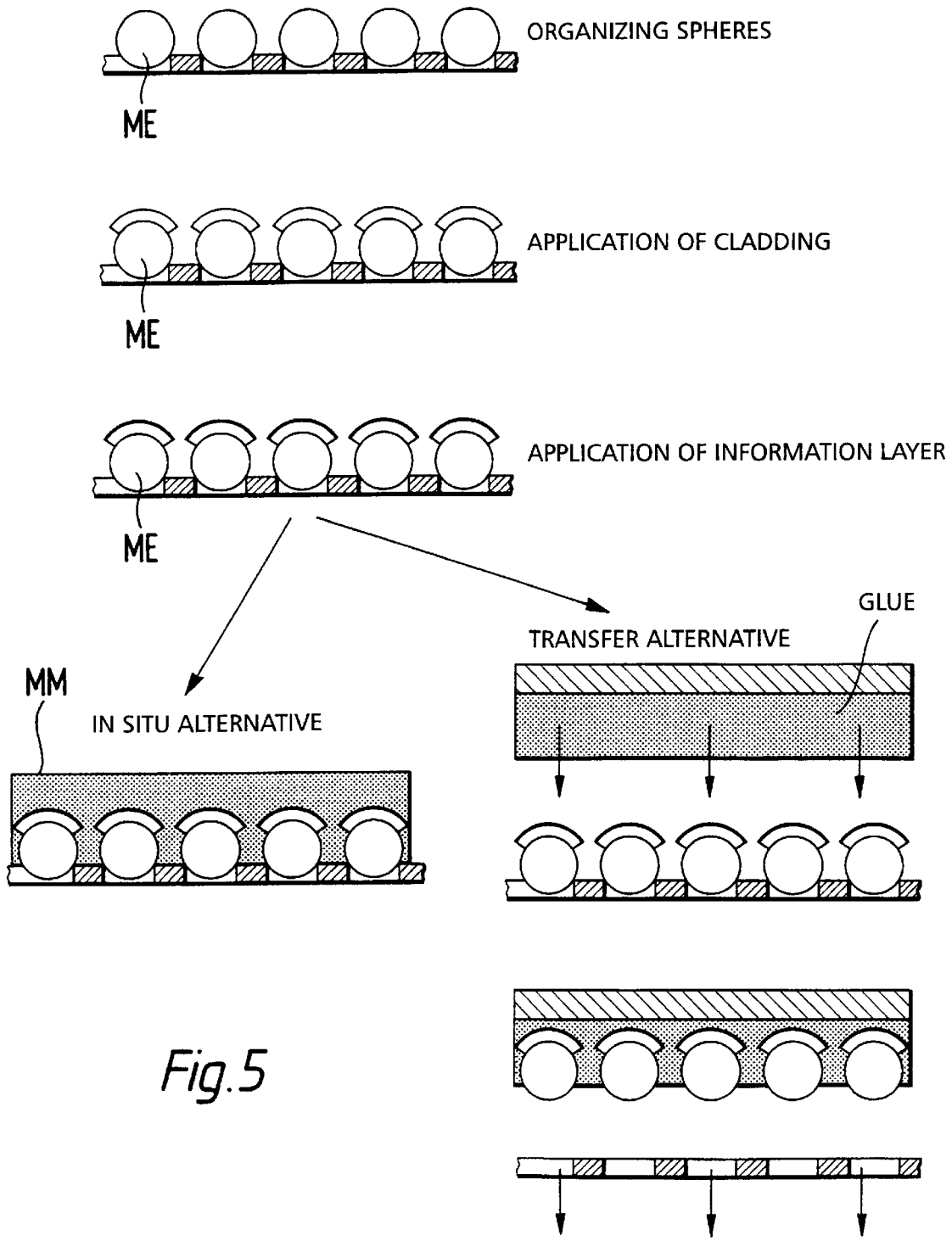

The memory module MM in FIG. 4b is one example of a wide range of possible architectures each of which will require a specific sequence of manufacturing steps. FIG. 5 illustrates manufacturing steps with two different processing methods, the first of which can be regarded as an in situ process with the spheres left in an organizing tool which becomes integrated with the memory module's optical structure, and a second as a process where the spheres are transferred from the organizing tool to a glue-covered surface. In the first case, therefore, the organizing tool will be mechanically integrated with the memory module following the preparation of the memory element. Reading and writing are performed by illuminating through the organizing tool. In the second case the memory element will as described be transferred to and immobilized on a separate retaining surface, following the preparation of the individual memory elements by the application of cladding and information layers on the microspheres.

There shall now be discussed how memory elements ME and memory modules MM according to the invention can be manufactured by direct shaping in connected sheets. In order to achieve the small focal spot sizes and thereby high data densities the memory elements must have a large numerical aperture and permit large off-normal angles of incidence without incurring unnecessary imaging errors. This implies that the front surface or the front, i.e. the focusing part of the memory element according to the invention should be aspheric, with a shape which has to be optimized for each choice of parameters, such as the range of angles of incidence, and the refractive index of the material in the memory element's structural member or transparent body. A flexible and low cost alternative is to manufacture the memory elements by moulding, casting or stamping a transparent polymer material, where the precise shape of each memory element is copied from a master. This permits independent optimization of both the front or the focusing part and the rear, i.e. the imaging location, and of the distance separating the two surfaces.

In other words, moulding, casting or stamping of the memory elements ME according to the invention provide great freedom with regard to the design of the memory element's structural member or transparent body. The processes which are envisaged being used in this connection are well known in the present day art and will therefore not be described in closer detail here. However, it is important to be able to apply the light-sensitive layer, i.e. the information layer and possibly implement other treatment operations in an efficient and economical manner. In practice this will mean that a large number of bodies for optical memory elements are oriented in the same direction during the treatment phase, possibly in a predetermined two-dimensional pattern. After the completion of treatment, which includes the writing in of data, the individual optical memory elements are released from one another. A simple method of temporarily attaching memory elements to one another is to roll, cast or stamp them in parallel in a large number, with a physical material connection between adjacent elements. The connections can be implemented as material bridges of thin material, break indication marks or break indication clefts, thus enabling the memory elements to be easily broken apart when the manufacturing process is over. A solution of this kind means that the cavities in a moulding tool used to mould the individual memory elements should be connected to a network of cross connections which provide the physical material connection between the individual memory elements during plastic moulding or casting.

While individual memory elements ME can be cast or moulded for use as identification agents, etc, compare the description of memory elements based on microspheres in the above, attention will now be focused on memory modules, i.e. assemblies of memory elements where the individual memory elements are linked side by side to form a two-dimensional sheet. As previously mentioned in connection with microsphere-based memory elements, this creates memory components with potentially very high data capacities and again possibilities for high speed parallel writing and reading of data.

Figure 6:
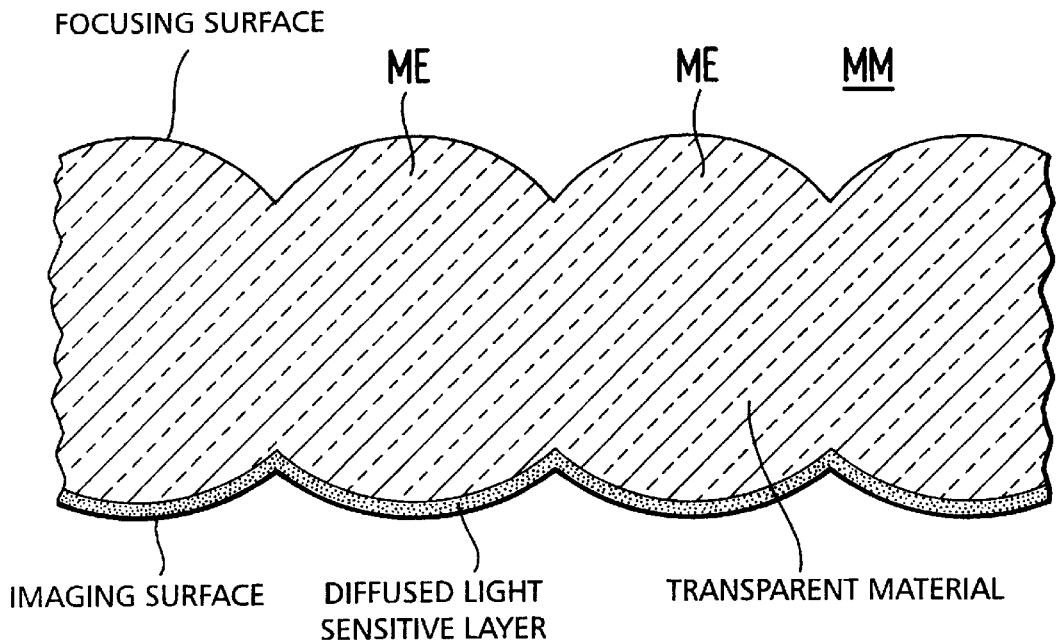
FIG. 6 a section through a portion of a memory module according to the invention.

FIG. 6 illustrates a section of a memory module MM and its optical structure, with connected memory elements ME which are merged together in order to form a flat sheet. The memory module is illustrated here with the information layer produced by controlled diffusion of a dye from the back. The solution which is illustrated in FIG. 6 is technically very simple. The individual memory elements and the linkages between them are created from the same material in an integral structure as shown. The structure shown in cross section in FIG. 6 may naturally contain a very large number of identical memory elements. Together they form a two-dimensional sheet, which can be made of a transparent polymer material by several different processes which are well known in the art and which permit a high production volume combined with low costs.

Figure 7:
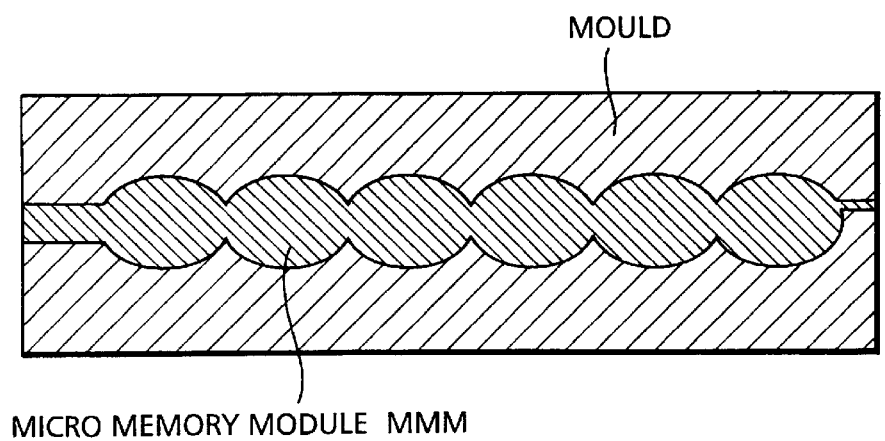
FIG. 7 a production method for a memory module according to the invention.

FIG. 7 illustrates schematically how a memory module MM is manufactured by moulding the optical structure from molten polymer material when this is injected into a cavity. This kind of injection process is well known from the production of compact disks (CD's) where precision requirements equal or exceed those which are relevant to the present invention. However, the curved surfaces in front and back have to be aligned relative to each other, i.e. in register to each other. This imposes requirements on the mould where the tolerances will depend on the size on each memory element ME, the desired focal spot diameter in each memory element and the total number of memory elements in each connected sheet. For large classes of relevant parameter values the desired precision can be achieved well within to-day's state of the art. In the case of memory elements where the imaging requirements are not too high, the imaging surface may be flat and the question of front-to-back surface registration is moot.

Figure 8:
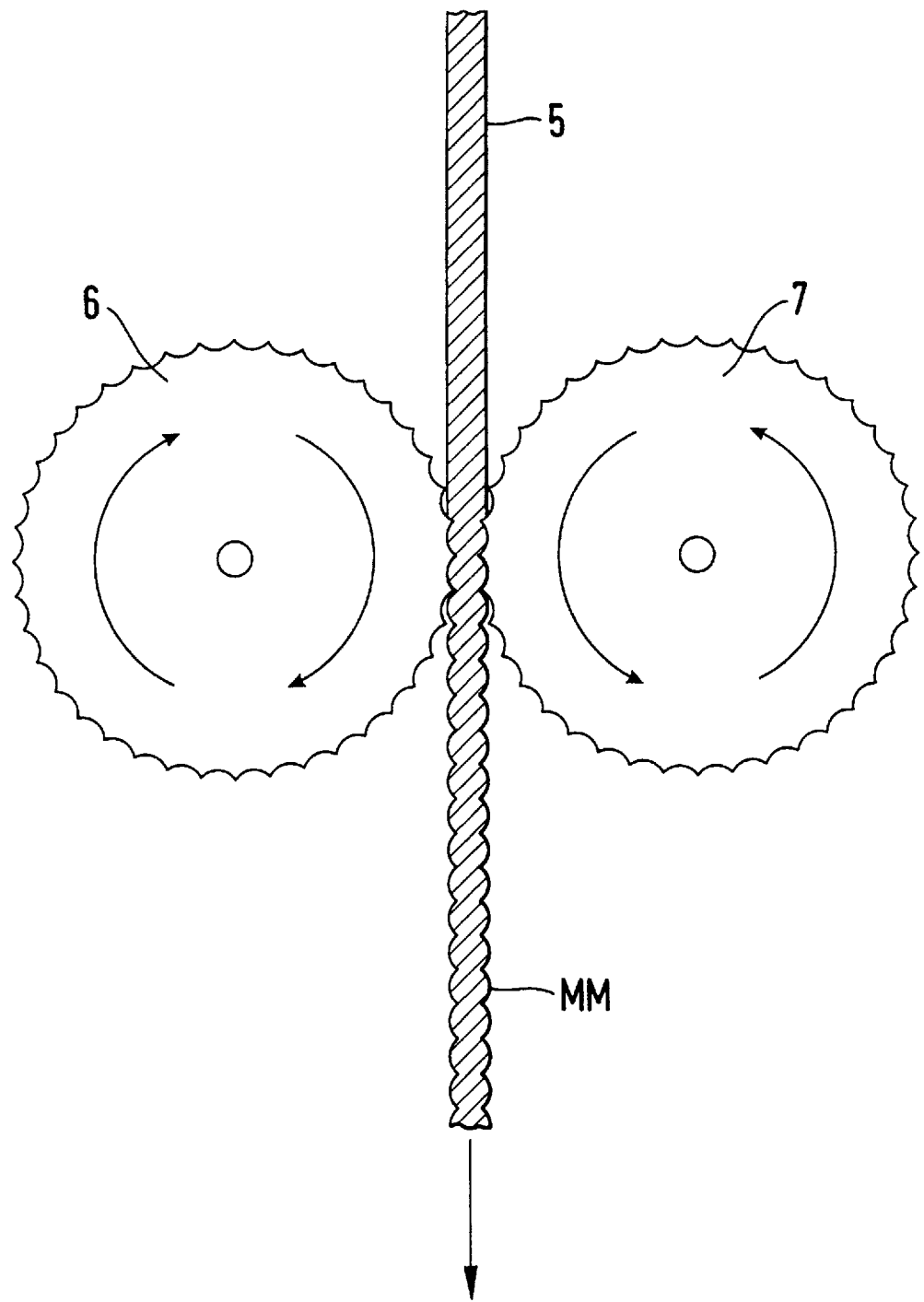
FIG. 8 an other production method for a memory module according to the invention.

FIG. 8 illustrates the manufacture of the memory module MM according to the invention by a production process where the optical structure is moulded between the top and the bottom of a planar polymer sheet 5 which is passed between two profiled rollers 6, 7. Hot rolling of polymers in reel-to-reel processes is well-known in the industry and the degree of reliability and resolution of the patterns which can be obtained is exemplified, e.g. in the production of holograms where the precision which is required will be fractions of the wavelength of light. The profiles of interest here are generally deeper than the holographic ones and may, e.g., involve the use of a layered or laminated planar starting sheet with easily mouldable polymer layers on the top and the bottom surface of a stiffer central core. Again the imaging surface on the back may simply be kept flat in cases where the imaging in the memory elements is not critical.

Figure 9:
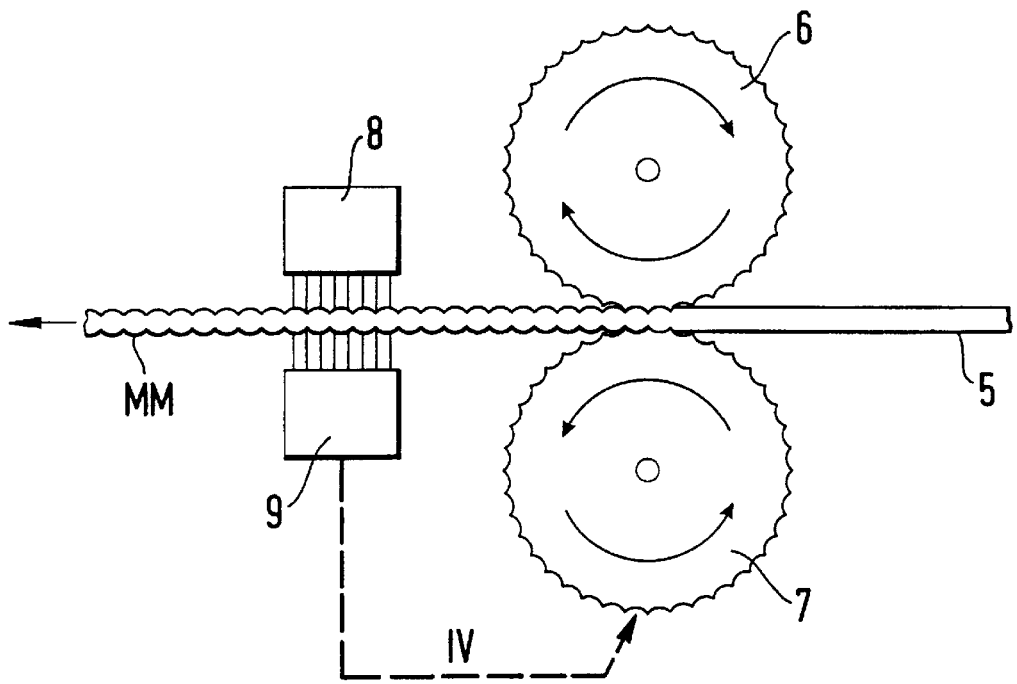
FIG. 9 schematic control of the production process for an optical memory module according to the invention.

When high density assemblies of memory elements ME according to the invention are employed, registration of the front and the rear surfaces of the memory elements between the two rollers will require a critical control of the angular positions of the rollers relative to each other. Instead of relying on high precision mechanical linkages, one roller may be slaved to the other via an active feedback control system which derives correction signals from the patterned sheet as it emerges from the rollers. This can be achieved by optical detection which can also be used for thickness control of the memory module sheet. An example of this is shown in FIG. 9, which schematically illustrates optical control of roller separation and roller rotation over a feedback loop. In this FIG. 8 indicates the illumination unit, 9 an optical detection system and the control signal which is fed back to the rollers 6, 7. Collimated light from the illumination unit 8 is directed straight down on to the focusing surface, with registration and thickness errors being detected in the detection system 9 by analysis of the light beam emerging from the bottom of the sheet.

An important feature which helps to make the production method based on rolling feasible is the possibility of performing the rolling operation on a sheet in the form of a tape in a reel-to-reel process, since the tape can be cut into desired lengths later. This allows the automatic feedback control system to establish acquisition and stabilization after start-up. The corresponding out-of-register portion at the beginning of the tape and possible subsequent substandard portions of the tape can easily be marked with ink or with other means, so that they can be discarded in later stages of the production process.

Figure 10:
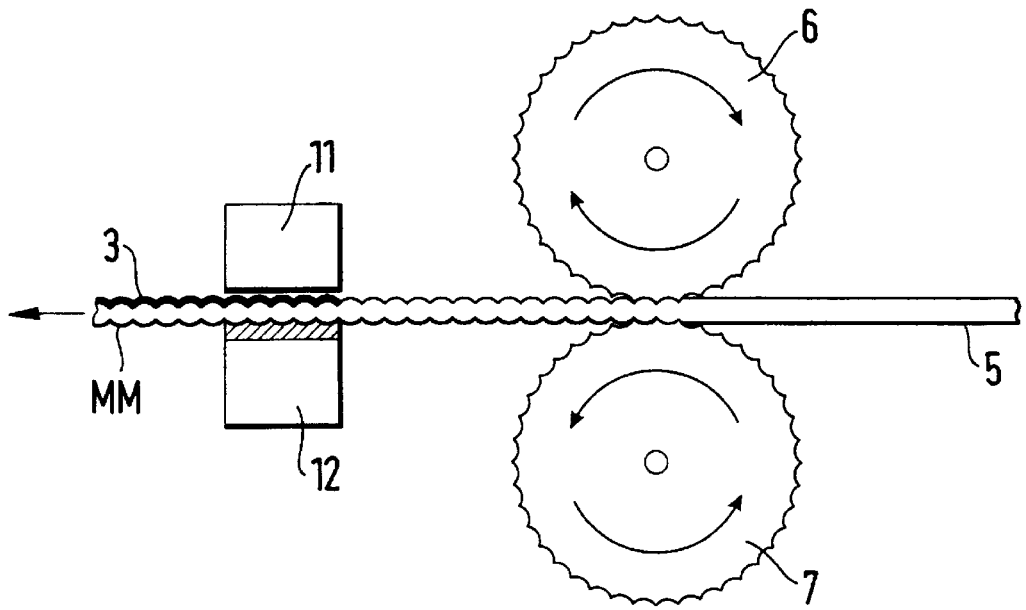
FIG. 10 an example of how an information-carrying layer is applied to an optical memory module according to the invention.

The tape format is very convenient for several of the production steps which follow the shaping of the top and bottom surfaces. Smoothing of the shaped surfaces can be performed by sweeping the tape past an infrared heating source causing partial surface melting, smoothing by surface tension and revelation. The same result can be obtained by physical or chemical polishing. Another example of a post-shaping process is the application of a light-sensitive burn layer as information layer. FIG. 10 shows an example of the application of the information layer 3 in the form of ink or dye, 11 being an applicator for ink or dye, while 12 is a back-pressure cushion. In FIG. 10 this is exemplified by the controlled diffusion of dye molecules into the imaging surface in a continuous reel-to-reel process.

A person skilled in the art will see that a number of to-day's known technical processes for the production of information-bearing media, regardless of the material, will also be able to be adapted for use in the manufacture of memory elements me and assemblies thereof in memory modules mm and connected structures, all within the scope of the invention.

I claim:

1. An optical memory element (ME) wherein data are written and read by means of light incident to the memory element, the memory element (ME) comprising an integrated unit created by a wholly or partly transparent body, that the body comprises a light-focusing part and at least one light-sensitive layer provided integrated with said light-focusing part, that at least one portion of a surface of the memory element (ME) is parallel to or approximately coincident with an imaging surface for the incident light which is focused through the light-focusing part, said light-sensitive layer being provided in said at least one portion of said surface and conformal therewith, and that said light-sensitive layer comprises a material whose optical properties can be changed by the influence of the incident light, said light-focusing part in its external form or volumetric refractive index distribution being arranged to focus the incident light at said light-sensitive layer.

2. An optical memory element according to claim 1, wherein the light-focusing part has a refracting surface profile.

3. An optical memory element according to claim 2, wherein the surface profile is a section of a spherical surface.

4. An optical memory element according to claim 1, wherein the light-focusing part is a lens with a graded refractive index (GRIN lens).

5. A method for manufacturing optical memory elements (ME) wherein data are written and read by means of light incident to the memory element, the method comprising designing the memory element (ME) in the form of a wholly or partly transparent body with a light-sensitive layer provided integrated therewith, forming said wholly or partly transparent body with a light-focusing part from a material whose refractive index or refractive index gradient is such that light incident to said body is focused at an opposite surface of said body, and forming at least one light-sensitive layer on said opposite surface or in said body immediately inside said opposite surface and conformal therewith, by the addition of a light-sensitive material, said addition being implemented by coating or diffusion of said light-sensitive material from the gas phase, vapour phase, liquid phase, solid phase or molten phase respectively.

6. A method according to claim 5, wherein the coating or diffusion of the light-sensitive material is performed by temporarily providing and mounting an array of bodies on a surface by means of a retaining means with an adhesive effect, the adhesive effect being controlled by thermal, chemical or physical influences.

7. A method according to claim 5, wherein the coating or the diffusion of the light-sensitive material is performed by bodies temporarily or permanently arranged in openings in a mesh or a membrane.

8. A method according to claim 7, wherein the openings in the mesh or the membrane form a predetermined pattern.

9. A method according to claim 5, wherein the coating or the diffusion of the light-sensitive material is performed with the bodies temporarily or permanently arranged in a topographic pattern on a surface.

10. A method according to claim 5, wherein the body is formed from a sphere, and that said sphere's refractive index or refractive index gradient is adapted depending on the wave front of the incident light.

11. A method according to claim 5, wherein the body is formed from a cylindrical rod, that at least a section ($1_1$) of said rod has a graded refractive index (GRIN rod), and that a possible further section ($1_2$) of said rod adjacent to and integrated with the aforesaid section of said rod has a homogeneous refractive index, the length of said possible further section ($1_2$) of said rod being adapted to the length of said section ($1_1$) having a graded refractive index.

12. A method according to claim 11, wherein when the cylindrical rod is composed of the GRIN rod only, one end of said GRIN rod is integrated with the light sensitive layer(s), and where said body comprises the possible further section ($1_2$) adjacent to and integrated with the GRIN rod and with a homogeneous refractive index, the end of said possible further section ($1_2$) opposite said GRIN rod is provided with said light sensitive layer(s).

13. A method according to claim 11, wherein the cylindrical GRIN rod is formed by cutting up an optical fibre with a graded refractive index (GRIN fibre).

14. A method according to claim 5, wherein the body is formed by plastic moulding from a polymer or glass material.

15. A method according to claim 5, wherein the body is formed by casting from a polymer or glass material.

16. A method for manufacturing optical memory elements (ME) wherein data are written and read by means of light incident to the memory element, the method comprising designing the memory element (ME) in the form of a wholly or partly transparent body, forming said wholly or partly transparent body with a light-focusing part from a material whose refractive index or refractive index gradient is too low for light incident to said body to be focused at an opposite surface of said light-focusing part, providing an optically transparent layer on the opposite surface, the thickness of said transparent layer being chosen so that light incident to said body is brought into focus near an outer side of said transparent layer, and forming at least one light-sensitive layer on the outside of said transparent layer integrated and conformal therewith by the addition of a light-sensitive material, said addition being implemented by coating or diffusion of said light-sensitive material from the gas phase, vapour phase, liquid phase, solid phase or molten phase respectively.

17. A method according to claim 16, wherein the coating or the diffusion of the light-sensitive material is performed by temporarily providing and mounting an array of bodies on a surface by means of a retaining tool with adhesive effect, the adhesive effect during coating or diffusion being controlled by thermal, chemical or physical influence respectively.

18. A method according to claim 16, wherein the coating or the diffusion of the light-sensitive material is performed with the bodies temporarily or permanently arranged in openings in a mesh or a membrane.

19. A method according to claim 18, wherein the openings in the mesh or the membrane form a predetermined pattern.

20. A method according to claim 16, wherein the coating or the diffusion of the light-sensitive material is performed with the bodies temporarily or permanently arranged in a topographical pattern on a surface.

21. A method according to claim 16, wherein the body is formed from a sphere, and a refractive index or refractive index gradient of said sphere is dependent on the wave front of the incident light.

22. A method according to claim 16, wherein the body is formed from a cylindrical rod (1), at least a section ($1_1$) of said (1) having a graded refractive index (GRIN rod), and a possible further section ($1_2$) of said rod has homogeneous refractive index adjacent to and integrated with the section of the rod, the length of said possible further section ($1_2$) of said rod being adapted to the length of said section ($1_1$) having a graded refractive index.

23. A method according to claim 22, wherein when the cylindrical rod is composed of the GRIN rod only, one end of said GRIN rod is integrated with the light-sensitive layer(s), and where said body comprises the possible further section ($1_2$) having a homogeneous refractive index is formed adjacent to and integrated with the GRIN rod, the end of said possible further section ($1_2$) opposite said GRIN rod is provided with light-sensitive layer(s).

24. A method according to claim 22, wherein the cylindrical GRIN rod is formed by cutting up an optical fibre with a graded refractive index (GRIN fibre).

25. A method according to claim 16, wherein the body is formed by plastic moulding from a polymer or glass material.

26. A method according to claim 16, the body is formed by casting from a polymer or glass material.

27. An optical memory module (MM), wherein the memory module comprises two or more optical memory elements (ME) according to claim 1, wherein data are written and read by means of light incident to the memory elements, and the individual memory elements (ME) are arranged immobilized in relation to one another in a two-dimensional surface.

28. An optical memory module (MM) according to claim 27, wherein the memory elements (ME) are arranged in a predetermined two-dimensional pattern.

29. An optical memory module (MM) according to claim 27, wherein one side of the memory module (MM) is flat and arranged so that it is located near the imaging surfaces of the optical memory elements (ME), or is tangent to or intersects the imaging surfaces of said optical memory elements (ME).

30. An optical memory module (MM) according to claim 27, wherein one side of the memory module (MM) has a surface profile which corresponds to a surface profile formed from the surfaces facing the incident light of the optical memory elements (ME) which form a part of said memory module, while a second, opposite surface (2) of said memory module (MM) has a surface profile which follows the imaging surface of said memory elements (ME), corresponding to respective areas of said memory module (MM) which are physically covered by each individual memory element (ME).

31. A method for manufacturing an optical memory module (MM), wherein the memory module (MM) comprises two or more optical memory elements (ME) produced by a method according to claim 5, wherein the memory module (MM) is produced from a matrix by moulding, casting or stamping in a continuous or discontinuous process or a mixture of such processes.

32. A method according to claim 31, wherein on one side of the memory module (MM) there are formed adjacent lenticular surface structures, while a second, opposite side of said memory module is planar.

33. AN method according to claim 31, wherein one side of the memory module (MM) is provided with a surface profile which corresponds to a surface profile formed by the surfaces facing the incident light of the optical memory elements (ME) which form a part of said memory module, while a second, opposite side of said memory module is provided with a surface profile which follows imaging surfaces of memory elements, corresponding to respective areas of said memory module which are physically covered by each individual memory element.

34. A method according to claim 31, wherein the memory module (MM) is produced by plastic moulding.

35. A method according to claim 31, wherein the memory module (MM) is produced by injection moulding.

36. A method according to claim 31, wherein the memory module (MM) is produced by moulding or stamping of a planar base material between stampers or rollers.

37. A method according to claim 36, wherein the planar base material is in the form of a long tape which is fed gradually or continuously to a moulding or stamping zone, and that after stamping said tape is cut to a predetermined format.

* * * * *